US012733537B2

(12) United States Patent
Shah et al.

(10) Patent No.: US 12,733,537 B2
(45) Date of Patent: Sep. 8, 2026

(54) TWO-PART MOLDING OF DEVICE PACKAGES WITH SPACERS

(71) Applicant: NXP USA, Inc., Austin, TX (US)

(72) Inventors: Ankur Shah, Chandler, AZ (US); Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 906 days.

(21) Appl. No.: 18/058,610

(22) Filed: Nov. 23, 2022

(65) Prior Publication Data

US 2024/0170357 A1 May 23, 2024

(51) Int. Cl.

| | |
|---|---|
| ***H10W 74/10*** | (2026.01) |
| ***B29C 45/14*** | (2006.01) |
| ***B29K 63/00*** | (2006.01) |
| ***B29L 31/34*** | (2006.01) |
| ***H10F 77/00*** | (2025.01) |
| ***H10F 77/50*** | (2025.01) |
| ***H10W 74/01*** | (2026.01) |
| ***H10W 74/15*** | (2026.01) |
| ***H10W 74/47*** | (2026.01) |
| ***H10W 90/00*** | (2026.01) |

(52) U.S. Cl.

CPC ..... *H10W 74/141* (2026.01); *B29C 45/14639* (2013.01); *H10F 77/50* (2025.01); *H10W 74/016* (2026.01); *H10W 74/147* (2026.01); *B29K 2063/00* (2013.01); *B29L 2031/3406* (2013.01); *H10F 77/93* (2025.01); *H10W 74/15* (2026.01); *H10W 74/47* (2026.01); *H10W 74/476* (2026.01); *H10W 90/724* (2026.01); *H10W 90/734* (2026.01); *H10W 90/754* (2026.01)

(58) Field of Classification Search

CPC . B29C 45/14639; H10F 77/50; H01L 21/565; H01L 23/3185; H01L 23/3192

See application file for complete search history.

(56) References Cited

U.S. PATENT DOCUMENTS

| | | | |
|---|---|---|---|
| 9,684,074 B2 | 6/2017 | Schrank et al. | |
| 11,112,352 B2 | 9/2021 | Lee et al. | |
| 2009/0152706 A1 | 6/2009 | Kuan et al. | |
| 2015/0357505 A1 | 12/2015 | Chang et al. | |
| 2019/0165019 A1 | 5/2019 | Wang et al. | |
| 2020/0335359 A1 | 10/2020 | Athavale et al. | |
| 2021/0050459 A1 | 2/2021 | Kummerl et al. | |
| 2022/0216353 A1* | 7/2022 | Etschmaier | H10F 39/804 |

FOREIGN PATENT DOCUMENTS

| | | |
|---|---|---|
| CN | 110112163 A | 8/2019 |
| EP | 3608952 A1 | 2/2020 |

OTHER PUBLICATIONS

Gilleo, Ken, et al., "Thermoplastic Electronic Packaging: Low Cost—High Versatility", IPC Printed Circuits Expo. (Year: 2006).*

* cited by examiner

*Primary Examiner* — Fernando L Toledo
*Assistant Examiner* — Ryan T. Fortin

(57) ABSTRACT

A device package is formed form a volume of molding material that encapsulates a component. Edges of the component are protected by encapsulated areas formed above the edges by a filler material prior to molding the component. The molding material also encapsulates the filler material and positioning of the filler material defines a location and dimensions of an aperture in the molding material that exposes a portion of a top surface of the component.

15 Claims, 4 Drawing Sheets

TWO-PART MOLDING OF DEVICE PACKAGES WITH SPACERS

FIELD OF THE INVENTION

Embodiments of the subject matter described herein relate to polymeric packages for semiconductor devices, electronic components, and other components and methods of fabricating such packages.

BACKGROUND OF THE INVENTION

Semiconductor devices and other electronic devices are frequently assembled into packages to protect the devices from damage and to provide macroscopic electrical contacts. Packages can be made of various materials including polymers and ceramics. Some electronic, optical, optoelectronic devices include components which must be exposed to the surroundings. Inserts can be used in film-assisted molding processes to create molded packages with openings for such components.

SUMMARY OF THE INVENTION

In an example embodiment, a method of fabricating a device package is provided. The method includes receiving a component and encapsulating two or more edges of the component by disposing a filler material over the two or more edges of the component. The filler material forms encapsulated areas above a top surface of the component that have substantially flat surfaces. The method further includes bringing a mold insert into contact with the substantially flat surfaces of the encapsulated areas and molding the component within a volume of molding material while the mold insert contacts the substantially flat surfaces of the encapsulated areas such that the component is encapsulated by molding material. The method further includes removing the mold insert produce a molded package around the component having an aperture with dimensions determined by positioning of the encapsulated surfaces above the component that exposes a portion of the top surface of the component.

In another example embodiment a device package is provided. The device package includes a component having two or more edges protected by a filler material that forms encapsulated areas above a top surface of the component that have substantially flat surfaces; a volume of molding material around the component that encapsulates the component and the filler material; and an aperture in the volume of molding material that exposes at least a portion of the component above the top surface of the component, wherein a location and one or more dimensions of the aperture are defined by positioning of the encapsulated areas formed by the filler material.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
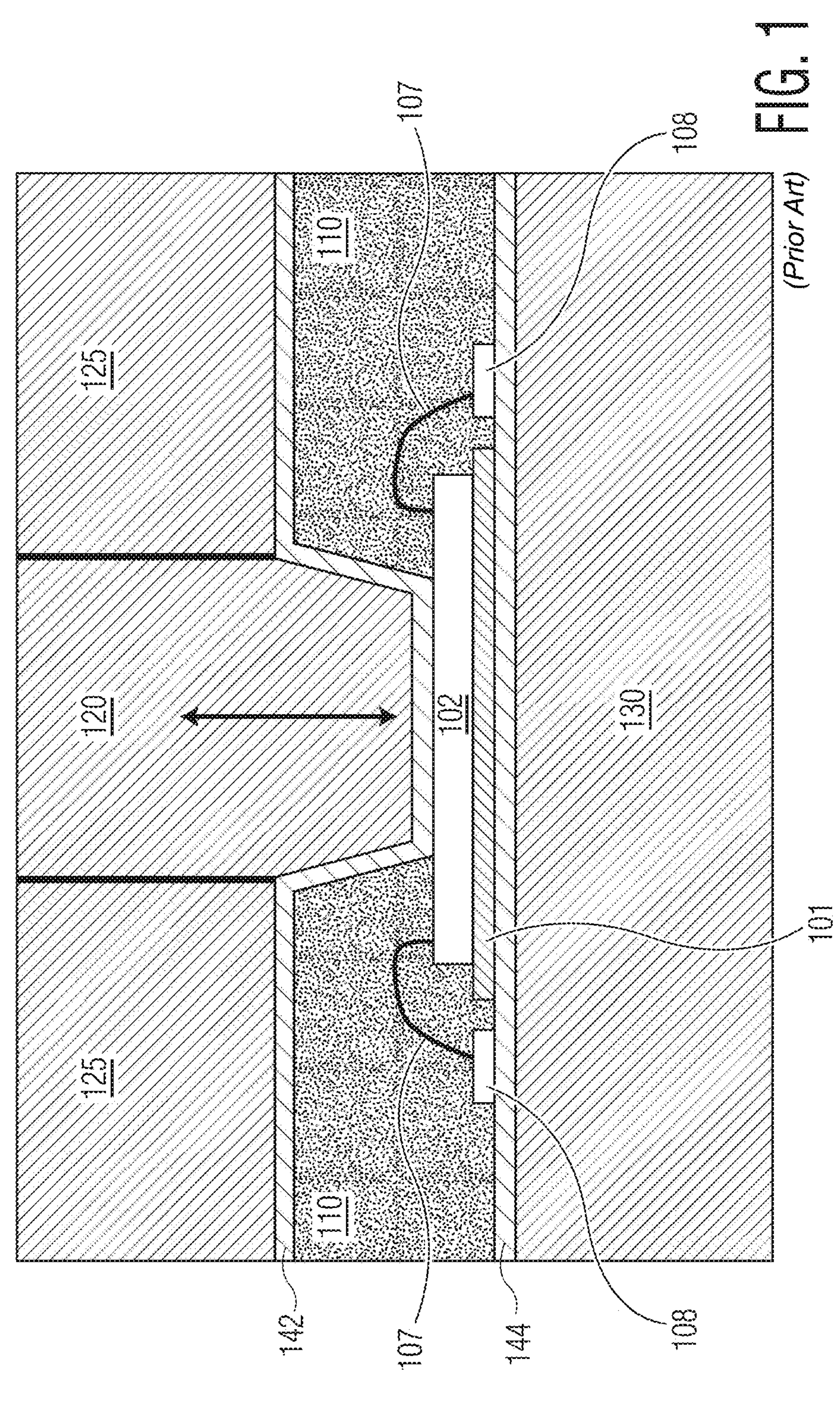
FIG. 1 is a cross-sectional illustration of film-assisted molding using an insert.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Unless explicitly stated otherwise, the use of terms "approximately," "substantially" and similar terms in connection with dimensions, relative positioning, or orientation of various features indicates that the dimensions, positioning, or orientation of those features are subject to tolerances and/or expected process variations of equipment and processes chosen to form the described features. Unless explicitly stated otherwise, the use of terms "approximately," "substantially" and similar terms in connection measurable values or characteristics is subject to the expected measurement accuracy of equipment and methods used to measure those values or characteristics and/or within tolerance limits specified by technical standards applicable to the technologies described.

Previous methods of forming molded packages with openings for devices such as optical sensors include film assisted molding processes in which an insert creates a barrier that prevents molding materials from covering portions of one or more components. FIG. 1 is a cross-section of an example process 100, in which a component 102 is molded within a volume of molding material 110 using an insert 120 between an upper plate 125 and a lower plate 130. As shown the component 102 sits on a substrate 101 (e.g., a leadframe or circuit board) and is connected to contact pads 108 via wire bonds 107. In this example, a film layer 142 is disposed between the upper plate 125 (and the insert 120) and the top of the component 102. A second film layer 144 is disposed between the substrate 101 and the lower plate 130. During the molding process the insert 120 passes through the upper plate 125 and presses the film layer 142 into contact with the die 102, thereby protecting the surface of the component 102 under the insert 120 from being covered by the molding material 110 as it is injected, extruded, or otherwise formed around the rest of the component 102. In some examples, the insert 120 may be hollow in order to accommodate parts with various topographies or sensitive components on their surfaces, as illustrated by FIGS. 2A, 2B, and 2C, which show example components molded using the example process 100.

Figures 2A, 2B, 2C:
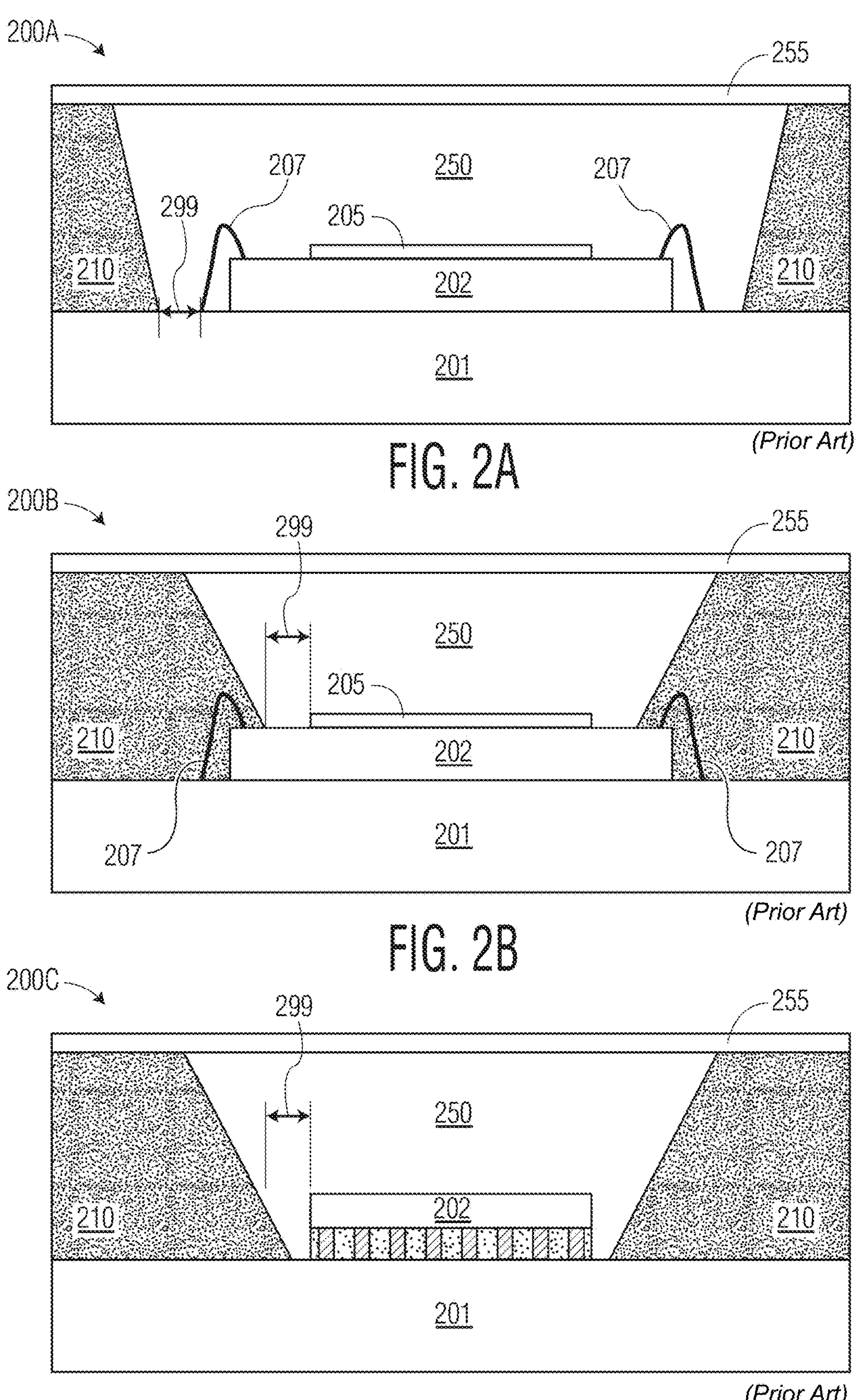
FIGS. 2A, 2B, and 2C are cross-sectional illustrations of example molded packages with moldings created by the process illustrated by FIG. 1

FIG. 2A shows a cross-section of a molded package 200A in which a component 202 that includes an optical component 205 (e.g., a photosensor) is molded with a volume of molding material 210 on a carrier 201 (e.g., a leadframe or carrier). In this example, the component 202 is connected to electrical contacts (not shown) via wire bonds 207. The component 202 sits within a cavity 250 defined by volume of molding material 210 and a window 255 (e.g., a plastic or glass cover). Alignment tolerances and other manufacturing tolerances of conventional film-assisted molding processes necessitate a minimum clearance 299 between edges structures within the cavity 250 and the molding material 210. In this instance, the minimum clearance 299 must be maintained between the edges of the wire bond 207 nearest the molding material 210 and the sidewalls of the cavity 250 defined by the molding material 210.

FIG. 2B shows a cross-section of a molded package 200B in which the distance between the edges of the optical component 205 and the wire bonds 207 is greater than the minimum clearance 299, allowing the wire bonds 207 to sit outside the cavity 250. It will be appreciated that in some instances, even when the dimensions of the component 202 and the wire bonds 207 allow for encapsulation of the wire bonds 207 in the molding material 210, that the wire bonds 207 may be too fragile to do so, requiring an arrangement similar to the molded package 200A.

FIG. 2C shows a cross-section of a molded package 200C in which the component 202 is coupled to electrical contacts (not shown) via pins 208 underneath the component 202, which are in turn surrounded by underfill material 209. In this example, the distance between the edges of the package and the sidewalls of the cavity 250 must still not be less than the minimum clearance 299.

It will be appreciated that the requirement of a minimum clearance (e.g., the minimum clearance 299) in previous approaches such as the example process 100 can undesirably limit the minimum size of packages requiring one or more cavities such as the cavity 250. Meanwhile, one or more embodiments herein enable the reduction of such minimum clearances resulting in reduced minimum package dimensions.

Figure 3A:
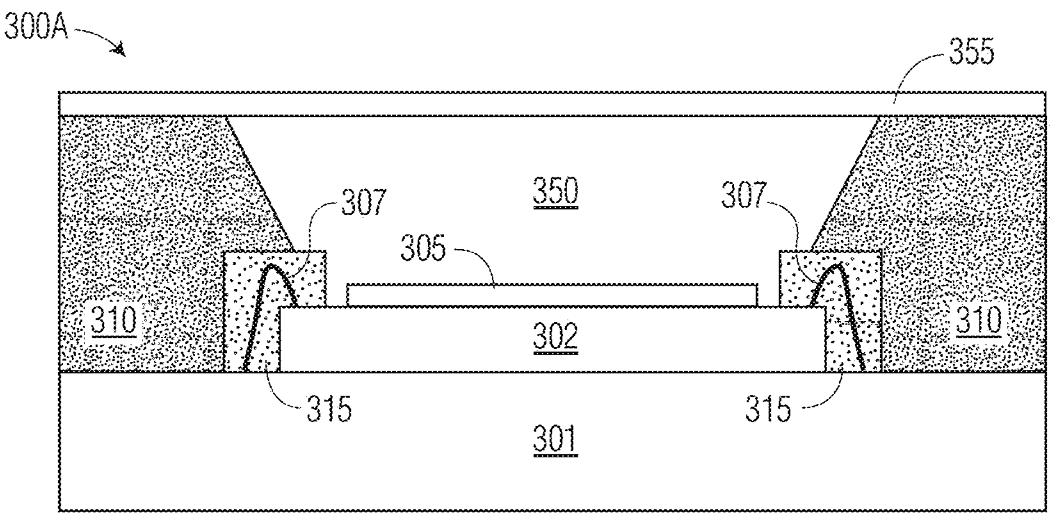
FIG. 3A is a cross-sectional illustration of an example molded part having wire-bonds to contact pads according to one or more embodiments.
Figure 3B:
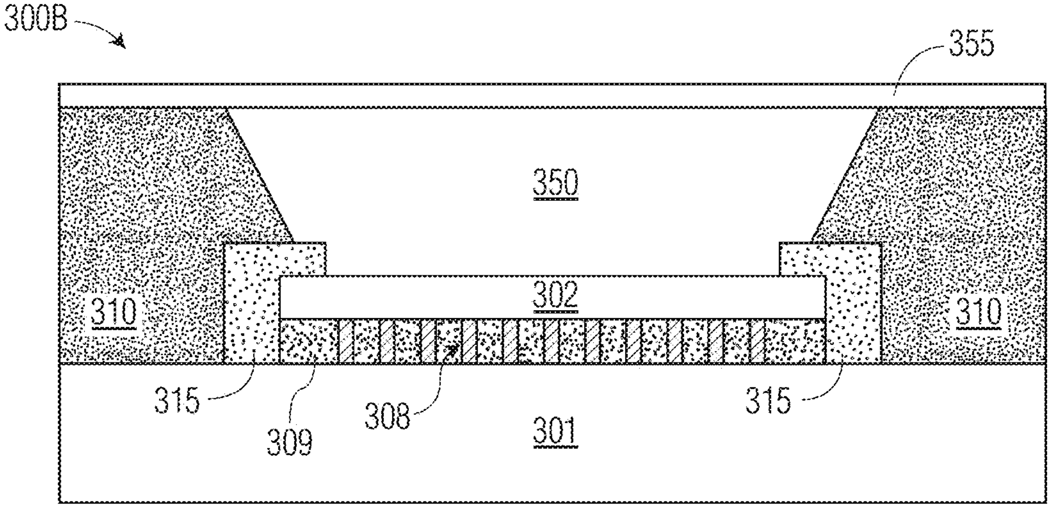
FIG. 3B is a cross-sectional illustration of another example molded part according to one or more embodiments.

Along these lines, FIG. 3A and FIG. 3B show example packages fabricated according to one or more embodiments herein and an example method of fabricating such packages is described below in connection with FIG. 4.

FIG. 3A is a cross-sectional view of a package 300A enclosing a component 302. The component 302 includes a sub-component 305 which may be an optical sensor or other optical device. In the example of FIG. 3A, the component 302 is bonded to a substrate 301 with wire bonds 307 which are encapsulated, along with edges of the component 302 in a filler material 315.

FIG. 3B is a cross-sectional view of an alternative package 300B enclosing the component 302 (shown without the sub-component 305 in this example). In the example of FIG. 3B, the component 302 is bonded to the substrate 301 via metal pillars, solder balls, or any other suitable backside interconnections 308. As shown these interconnections may be surrounded by additional filler material 309 or any other suitable material. The edges of the component 302 are encapsulated by the filler material 315, forming spacers.

As described below in connection with FIG. 4, a mold insert (e.g., the mold insert 420 of FIG. 4) may be brought into contact with spacers formed from filler material such as the filler material 315, causing it to rest above the component 302 during a molding process, allowing the component 302 to be encapsulated in the volume of molding material 310 and forming an aperture 350. As shown in FIG. 3A and FIG. 3B, in one or more embodiments, a cover such as the cover 355 is added to seal a package such as the package 300A or the package 300B. The cover 355 may be quartz, glass, plastic, or any other suitable material.

Figure 4:
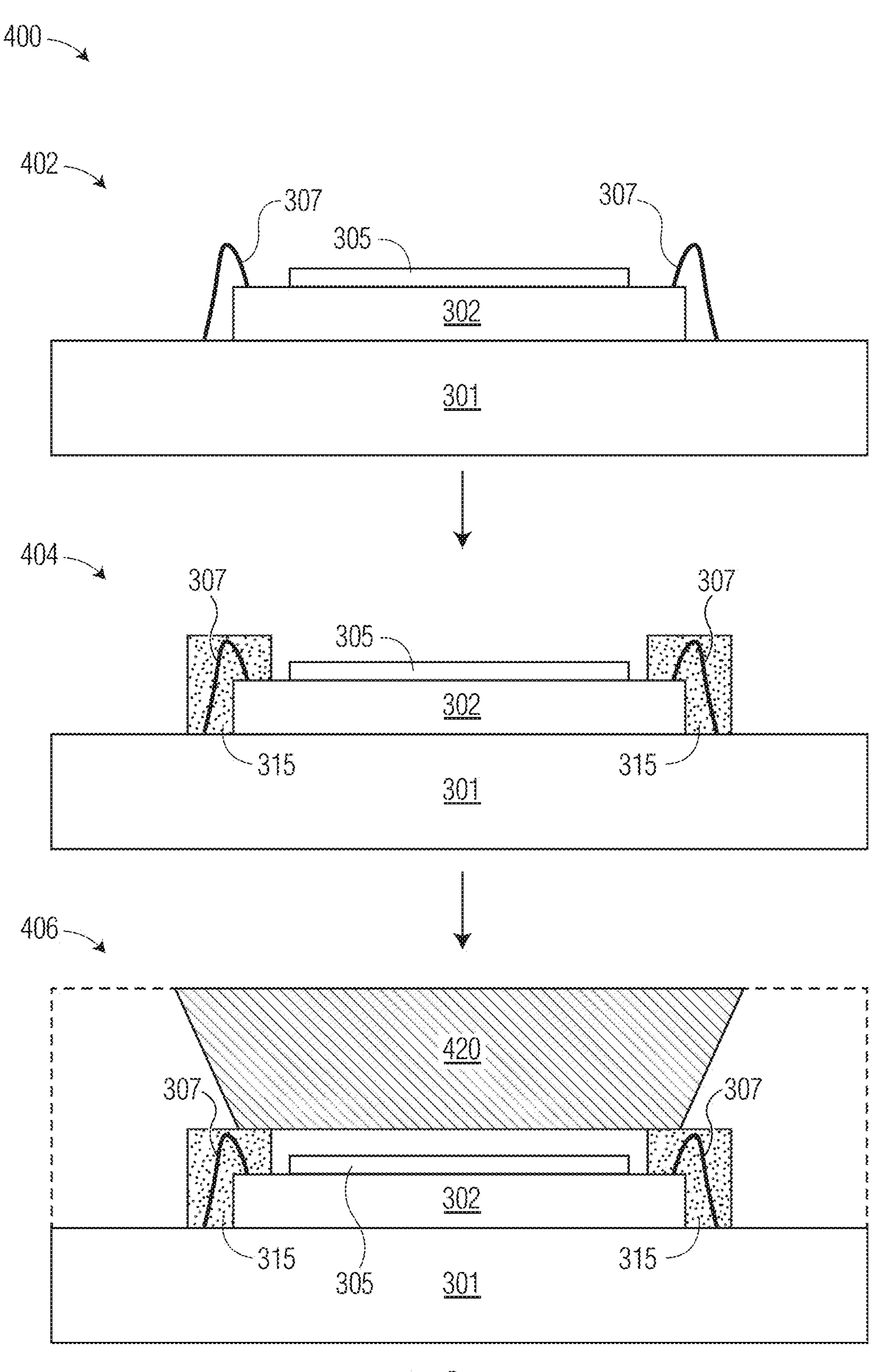
FIG. 4 is a cross-sectional illustration of steps in an example process for fabricating the molded parts such as the parts depicted in FIGS. 3A and 3B according to one or more embodiments.

FIG. 4 illustrates steps in an example process for fabricating a package using a two-step film-assisted molding process according to one or more embodiments herein. Accordingly, the steps 402, 404, and 406 of the process 400 are illustrated and described with reference to the package 300A and the components shown in FIG. 3A.

First, at step 402, the component 302 is provided on a substrate 301 such as a leadframe or other suitable carrier. In this example, the component 302 includes an optical component 305 or another portion which should be exposed in the resulting package (e.g., the package 300A). In this example, the component 302 is also shown with wire bonds 307 although it will be understood that there is no requirement for a component to be wire-bonded in one or more embodiments.

At step 404, the edges of the component 302 (including the wire bonds 307 in this example) are encapsulated within the filler material 315. The filler material 315 may be any suitable material. In one or more embodiments, a gel-based filler material is used, such as a silicon-based gel and/or a polyurethane-based gel, as nonlimiting examples. In one or more embodiments, an epoxy-based filler material is used, such as Cresol novolac, bisphenol-A, and bisphenol-F, as nonlimiting examples. The mechanical properties of the filler material can be chosen to suit a particular application. For example, in one or more embodiments, the filler material may be relatively inelastic, whereas in one or more other embodiments, the filler material may be relatively elastic. Furthermore, in one or more embodiments the filler material is placed or otherwise formed over the component being packaged in an uncured state characterized by first elastic modulus value and then cured in a subsequent step to form a cured filler material characterized by a second elastic modulus value that is greater than the elastic modulus value for the uncured material.

In one or more embodiments, a filler material such as the filler material 315 is a prefabricated article formed from any suitable material including, as nonlimiting examples, ceramics, silicon, glass, quartz, cured polymeric materials, and the like. In one or more embodiments such prefabricated pieces are bonded to the component being molded (e.g., the component 302) and/or to a substrate that includes the component (e.g., the substrate 301).

At step 406, the component 302, together with the filler material 315 is molded using film assisted molding (e.g., using the process 100) or any other suitable process. As shown the filler material 315 can be used to support a mold insert 420 (e.g., the mold insert 120) above one or more portions of the component 302 where the mold insert 420 could not otherwise be placed (e.g., on the bond wires 307 or within a distance from the bond wires 307 or the optical component 305 that is smaller than a minimum clearance distance (e.g., the minimum clearance 299 as seen in FIG. 2). The positioning and width of the filler material can be adjusted to suit particular applications. For example, the width and height of the filler material can be adjusted such that the cavity formed (e.g., the cavity 350) after subsequent film assisted molding with a mold insert (e.g., the mold insert 420) in place limits the field of view of an optical sensor or blocks off-axis light from reaching such a sensor. As another example the filler dimensions and positioning can be adjusted so that the resulting cavity helps collimate light output from an optical device.

In one or more embodiments (e.g., at step 406 of the process 400), a filler material such as the filler material 315 is an epoxy-based material that is placed or otherwise formed in an uncured state or in a partially-cured state. In one or more such embodiments, during a molding process, a mold insert (e.g., the mold insert 420) is brought into contact with uncured or partially cured filler material and the material is allowed to flow or deform under pressure, forming substantially flat surfaces and/or allowing the mold insert to be self-leveled by the application of pressure to the filler material as the mold insert is brought into contact with the filler material. In one or more embodiments, the epoxy is cured while the mold insert contacts the epoxy above a component to be molded such as the component 302.

In one or more embodiments, the filler material is placed or otherwise formed and then partially cured to form a partially cured filler with a greater elastic modulus than the uncured material. In one or more such embodiments, the partially cured filler material may subsequently undergo additional curing to reach a cured state in which its elastic modulus is further increased. In one or more embodiments, the filler material may undergo final curing together with curing of a volume of molding material (e.g., molding material 110 or molding material 310) formed in a subsequent molding process such as the process 100 or any other suitable process.

In one or more embodiments (e.g., at step 406 of the process 400), a filler material such as the filler material 315 is a gel material such as a silicone-based gel or a polyurethane-based gel, as nonlimiting examples. In one or more such embodiments, during a molding process, a mold insert (e.g., the mold insert 420) is brought into contact with gel material and the material is allowed to flow or deform under pressure, forming substantially flat surfaces and/or allowing the mold insert to be self-leveling. In one or more embodiments, the gel material is hardened while the mold insert contacts the gel-based filler material above a component to be molded such as the component 302. As with epoxy-based filler materials, gel-based filler materials can be dispensed or otherwise formed in an uncured state and then partially or completely cured before being contacted by the mold insert using any suitable curing process, including thermal curing and photocuring as nonlimiting examples.

In one or more embodiments, a package (e.g., the package 300A or the package 300B) formed by a process such as the process 400 has an aperture (e.g., an aperture 350) that is configured to define a field of view an optical device (e.g., the optical component 305). In one or more embodiments a package (e.g., the package 300A or the package 300B) formed by a process such as the process 400 has an aperture (e.g., an aperture 350) that is configured to collimate the optical output of a light source or other optical device.

VARIOUS EXAMPLES

Features of embodiments may be understood by way of one or more of the following examples:

Example 1: A device package and method for fabricating a device package that includes a component having two or more edges having a filler material disposed over the two or more edges of the component. The filler material forms encapsulated areas above a top surface of the component that have substantially flat surfaces. The component and the package are encapsulated in volume of molding material. The volume of molding material includes an aperture with dimensions determined by positioning of the encapsulated surfaces above the component that exposes a portion of the top surface of the component.

Example 2: The device package or method of Example 1 in which the aperture is formed by bringing a mold insert into contact with the substantially flat surfaces of the encapsulated areas and molding the component within a volume of molding material while the mold insert contacts the substantially flat surfaces of the encapsulated areas such that the component is encapsulated by molding material. The mold insert is removed produce a molded package around the component that includes the aperture.

Example 3: The device package or method of Example 1 or Example 2 in which the component is bonded to a substrate with wire bonds; and the filler material also encapsulates the wire bonds.

Example 4: The device package or method of any of Examples 1-3 in which the component is molded by performing a film-assisted molding process in which a molding film is disposed between a mold insert and the component while the mold insert contacts the substantially flat surfaces of the encapsulated areas.

Example 5: The device package or method of any of Examples 1-4 in which the filler material is an epoxy material disposed above the two or more edges of the component, Example 6: The device package or method of any of Examples 1-5 in which a mold insert is leveled above the component by allowing epoxy-based filler material to flow underneath the mold insert as it is brought into contact with the encapsulated areas.

Example 7: The device package or method of any of Examples 1-6 The method of claim 5, further comprising fully curing the epoxy-based material after the mold insert is brought into contact with the encapsulated areas.

Example 8: The device package or method of any of Examples 1-4 in which the filler material is a gel material.

Example 9: The device package or method of Example 8 that includes leveling a mold insert above the component by allowing a gel material to deform underneath the mold insert as it is brought into contact with the encapsulated areas.

Example 10: The device package or method of Example 8 or Example 9 that includes hardening a gel material after a mold insert is brought into contact with the encapsulated areas.

Example 11: The device package or method of any of Examples 1-10 where the component includes an optical sensor and the encapsulated areas and a mold insert used to mold the component are configured such that the aperture defines a field of view of the optical sensor.

Example 12: The device package or method of any of Examples 1-11 where the component includes an optical device and the encapsulated areas and the mold insert are configured such that the aperture collimates an optical output of the optical device Example 13: The device package or method of any of Examples 1-12 in which the filler material includes prefabricated elements bonded to the component and/or to the substrate where the prefabricated elements overhang two or more edges of the component.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A method of fabricating a device package, the method comprising:

receiving a component;

encapsulating two or more edges of the component by disposing a filler material over the two or more edges of the component such that the filler material forms encapsulated areas above a top surface of the component, the encapsulated areas having substantially flat surfaces;

bringing a mold insert into contact with the substantially flat surfaces of the encapsulated areas;

molding the component within a volume of molding material while the mold insert contacts the substantially flat surfaces of the encapsulated areas such that the component is encapsulated by molding material; and removing the mold insert produce a molded package around the component having an aperture above the component with dimensions determined by positioning of the encapsulated surfaces;

wherein molding the component comprises performing a film-assisted molding process in which a molding film is disposed between the mold insert and the component while the mold insert contacts the substantially flat surfaces of the encapsulated areas.

2. The method of claim 1, wherein the component is bonded to a substrate with wire bonds; and wherein encapsulating the two or more edges of the component comprises encapsulating the wire bonds in the filler material of the encapsulated areas.

3. The method of claim 1, wherein encapsulating the two or more edges of the component in the filler material comprises dispensing an epoxy-based material to form the encapsulated areas.

4. The method of claim 3, wherein encapsulating the two or more edges of the component in the filler material further comprises leveling the mold insert above the component by allowing the epoxy-based material to flow underneath the mold insert as it is brought into contact with the encapsulated areas.

5. The method of claim 4, further comprising fully curing the epoxy-based material after the mold insert is brought into contact with the encapsulated areas.

6. The method of claim 1, wherein encapsulating the two or more edges of the component in the filler material comprises dispensing a gel material to form the encapsulated areas.

7. The method of claim 6, wherein encapsulating the two or more edges of the component in the filler material further comprises leveling the mold insert above the component by allowing the gel material to deform underneath the mold insert as it is brought into contact with the encapsulated areas.

8. The method of claim 7, further comprising hardening the gel material after the mold insert is brought into contact with the encapsulated areas.

9. The method of claim 1, wherein the component comprises an optical sensor and the encapsulated areas and the mold insert are configured such that the aperture defines a field of view of the optical sensor.

10. The method of claim 1, wherein the component comprises an optical device and the encapsulated areas and the mold insert are configured such that the aperture collimates an optical output of the optical device.

11. The method of claim 1, wherein encapsulating the two or more edges of the component in the filler material comprises bonding prefabricated elements to the component and/or to a substrate that overhang two or more edges of the component.

12. The method of claim 1, wherein the component is bonded to a substrate; and wherein encapsulating the two or more edges of the component in the filler material comprises bonding prefabricated elements to the substrate such that the prefabricated elements overhang two or more edges of the component.

13. The method of claim 1, wherein the component is bonded to a substrate; and wherein encapsulating the two or more edges of the component in the filler material comprises bonding prefabricated elements to both the substrate and the component such that the prefabricated elements overhang two or more edges of the component.

14. A method of fabricating a device package, the method comprising:

receiving a component on a substrate;

encapsulating two or more edges of the component by bonding prefabricated elements to the substrate that overhang two or more edges of the component such that the prefabricated elements form encapsulated areas above a top surface of the component, the encapsulated areas having substantially flat surfaces;

bringing a mold insert into contact with the substantially flat surfaces of the encapsulated areas;

molding the component within a volume of molding material while the mold insert contacts the substantially flat surfaces of the encapsulated areas such that the component is encapsulated by molding material; and removing the mold insert produce a molded package around the component having an aperture above the component with dimensions determined by positioning of the encapsulated surfaces;

wherein molding the component comprises performing a film-assisted molding process in which a molding film is disposed between the mold insert and the component while the mold insert contacts the substantially flat surfaces of the encapsulated areas.

15. A method of fabricating a device package, the method comprising:

receiving a component;

encapsulating two or more edges of the component by bonding prefabricated elements to the component that overhang two or more edges of the component such that the prefabricated elements form encapsulated areas above a top surface of the component, the encapsulated areas having substantially flat surfaces;

bringing a mold insert into contact with the substantially flat surfaces of the encapsulated areas;

molding the component within a volume of molding material while the mold insert contacts the substantially flat surfaces of the encapsulated areas such that the component is encapsulated by molding material; and removing the mold insert produce a molded package around the component having an aperture above the component with dimensions determined by positioning of the encapsulated surfaces;

wherein molding the component comprises performing a film-assisted molding process in which a molding film is disposed between the mold insert and the component while the mold insert contacts the substantially flat surfaces of the encapsulated areas.

* * * * *